United States Patent
Kumar et al.

(10) Patent No.: US 10,720,904 B2
(45) Date of Patent: Jul. 21, 2020

(54) TECHNIQUES FOR INPUT FORMATTING AND COEFFICIENT SELECTION FOR SAMPLE RATE CONVERTER IN PARALLEL IMPLEMENTATION SCHEME

(71) Applicant: Analog Devices International Unlimted Company, Limerick (IE)

(72) Inventors: Vinoth Kumar, Trichy (IN); Bhanu Pande, Bangalore (IN); Carroll C. Speir, Pleasant Garden, NC (US); Satishchandra G. Rao, Bangalore (IN); Sajkapoor P. K., Bangalore (IN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/188,146

(22) Filed: Nov. 12, 2018

(65) Prior Publication Data
US 2020/0153415 A1    May 14, 2020

(51) Int. Cl.
*H03M 7/00* (2006.01)
*H03H 17/06* (2006.01)

(52) U.S. Cl.
CPC .............................. *H03H 17/0621* (2013.01)

(58) Field of Classification Search
CPC ................ H03H 17/0621; H03H 17/0427
USPC .............................................. 341/61, 50, 51
See application file for complete search history.

(56) References Cited

U.S. PATENT DOCUMENTS

| | | | | |
|---|---|---|---|---|
| 6,847,313 B2 * | 1/2005 | Biswas | .............. | H03H 17/0275 341/143 |
| 7,129,861 B2 * | 10/2006 | Avantaggiati | ...... | H03H 17/0621 341/61 |
| 7,236,110 B2 * | 6/2007 | Antonesei | .......... | H03H 17/0275 341/143 |
| 7,246,638 B2 * | 7/2007 | Vial | .......................... | B43K 5/14 141/20.5 |

(Continued)

OTHER PUBLICATIONS

DSP C5000, Chapter 20, Polyphase FIR Filter Implementation for Communication Systems, © 2003 Texas Instruments, 28 slides.

(Continued)

*Primary Examiner* — Jean B Jeanglaude
(74) *Attorney, Agent, or Firm* — Patent Capital Group

(57) ABSTRACT

A sample rate converter ("SRC") for implementing a rate conversion L/M is described wherein data is input to the SRC at an input rate ("$F_{in}$") and output from the SRC at an output rate ("$F_{out}$") equal to $F_{in}*L/M$. The SRC includes a low pass filter ("LPF") including P multiply-add instances, wherein P is a parallelization factor of the SRC; an input formatter for arranging samples received at the SRC in accordance with the rate conversion L/M and providing $P*T_{pp}$ input samples to the filter at a given time, wherein $T_{pp}$ is a number of taps per phase of the LPF; and a coefficient bank for storing a plurality of coefficients and for providing $P*T_{pp}$ of the coefficients to the LPF at a given time.

20 Claims, 12 Drawing Sheets

(56) References Cited

U.S. PATENT DOCUMENTS

| | | | |
|---|---|---|---|
| 8,346,834 B2 * | 1/2013 | Bostaman | H03H 17/0685 |
| | | | 708/300 |
| 9,258,011 B2 | 2/2016 | Whikehart et al. | |
| 9,331,703 B1 | 5/2016 | Cheung | |
| 9,379,886 B2 | 6/2016 | Kim et al. | |
| 2005/0111540 A1 * | 5/2005 | Modrie | G11B 20/10009 |
| | | | 375/232 |
| 2009/0143884 A1 | 6/2009 | Chieng et al. | |
| 2012/0033771 A1 | 2/2012 | Wei | |
| 2012/0066280 A1 | 3/2012 | Tsutsui | |
| 2012/0082457 A1 | 4/2012 | Yang et al. | |
| 2016/0006445 A1 | 1/2016 | Lindahl et al. | |
| 2018/0062623 A1 | 3/2018 | Pagnanelli | |

OTHER PUBLICATIONS

Hentschel et al., *The Digital Front-End of Software Radio Terminals*, IEEE Personal Communications, Aug. 1999, 7 pages.

Jacob et al., *Design and Implementation of Polyphase Decimation Filter*, IRACST—International Journal of Computer Networks and Wireless Communications (INJNWC), ISSN: 2250-3501, vol. 4, No. 2, Apr. 2014, 5 pages.

Arar, *The Polyphase Implementation of Interpolation Filters in Digital Signal Processing*, Dec. 6, 2017, 11 pages.

* cited by examiner

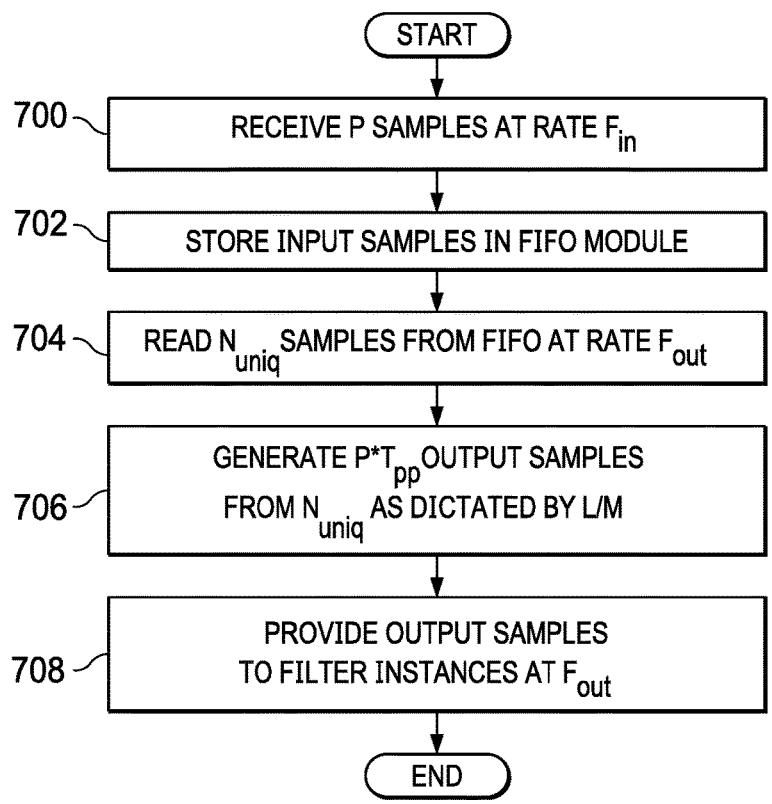
FIG. 7
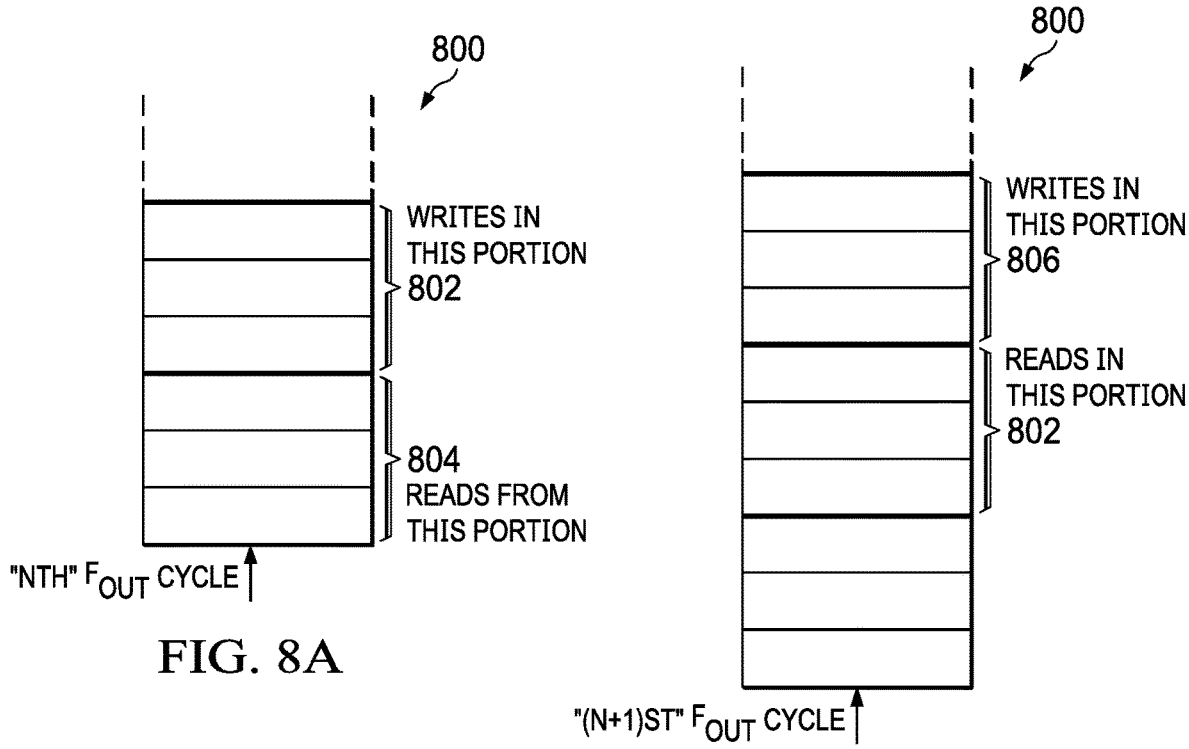
FIG. 8A
FIG. 8B

| | 1104 | PARALLEL LINES 0 TO 7 - COEFFICIENT SETS REQUIRED ON EACH LINE BASED ON L/M 1102 | | | | | | | |
|---|---|---|---|---|---|---|---|---|---|
| | FOUT CYCLE NO | 0 | 1 | 2 | 3 | 4 | 5 | 6 | 7 |
| | 0 | 0 | 31 | 62 | 93 | 28 | 59 | 90 | 25 |
| | 1 | 56 | 87 | 22 | 53 | 84 | 19 | 50 | 81 |
| | 2 | 16 | 47 | 78 | 13 | 44 | 75 | 10 | 41 |
| | 3 | 72 | 7 | 38 | 69 | 4 | 35 | 66 | 1 |
| | 4 | 32 | 63 | 94 | 29 | 60 | 91 | 26 | 57 |
| | 5 | 88 | 23 | 54 | 85 | 20 | 51 | 82 | 17 |
| | 6 | 48 | 79 | 14 | 45 | 76 | 11 | 42 | 73 |
| | 7 | 8 | 39 | 70 | 5 | 36 | 67 | 2 | 33 |
| | 8 | 64 | 95 | 30 | 61 | 92 | 27 | 58 | 89 |
| | 9 | 24 | 55 | 86 | 21 | 52 | 83 | 18 | 49 |
| | 10 | 80 | 15 | 46 | 77 | 12 | 43 | 74 | 9 |
| | 11 | 40 | 71 | 6 | 37 | 68 | 3 | 34 | 65 |
| REPEATS FROM HERE → | 12 | 0 | 31 | 62 | 93 | 28 | 59 | 90 | 25 |
| | 13 | 56 | 87 | 22 | 53 | 84 | 19 | 50 | 81 |
| | 14 | 16 | 47 | 78 | 13 | 44 | 75 | 10 | 41 |
| | 15 | 72 | 7 | 38 | 69 | 4 | 35 | 66 | 1 |
| | 16 | 32 | 63 | 94 | 29 | 60 | 91 | 26 | 57 |
| | 17 | 88 | 23 | 54 | 85 | 20 | 51 | 82 | 17 |
| | 18 | 48 | 79 | 14 | 45 | 76 | 11 | 42 | 73 |
| | 19 | 8 | 39 | 70 | 5 | 36 | 67 | 2 | 33 |
| | 20 | 64 | 95 | 30 | 61 | 92 | 27 | 58 | 89 |
| | 21 | 24 | 55 | 86 | 21 | 52 | 83 | 18 | 49 |
| | 22 | 80 | 15 | 46 | 77 | 12 | 43 | 74 | 9 |
| | 23 | 40 | 71 | 6 | 37 | 68 | 3 | 34 | 65 |
| | 24 | 0 | 31 | 62 | 93 | 28 | 59 | 90 | 25 |
| | 25 | 56 | 87 | 22 | 53 | 84 | 19 | 50 | 81 |

FIG. 12

| FOUT CYCLE NO | PARALLEL LINES 0 TO 7 - COEFFICIENT SETS REQUIRED ON EACH LINE BASED ON L/M | | | | | | | |
|---|---|---|---|---|---|---|---|---|
| | 0 | 1 | 2 | 3 | 4 | 5 | 6 | 7 |
| 0 | 0 | 25 | 30 | 75 | 4 | 29 | 54 | 79 |
| 1 | 8 | 33 | 58 | 83 | 12 | 37 | 62 | 87 |
| 2 | 16 | 41 | 66 | 91 | 20 | 45 | 70 | 95 |
| 3 | 24 | 49 | 74 | 3 | 28 | 53 | 78 | 7 |
| 4 | 32 | 57 | 82 | 11 | 36 | 61 | 86 | 15 |
| 5 | 40 | 65 | 90 | 19 | 44 | 69 | 94 | 23 |
| 6 | 48 | 73 | 2 | 27 | 52 | 77 | 6 | 31 |
| 7 | 56 | 81 | 10 | 35 | 60 | 85 | 14 | 39 |
| 8 | 64 | 89 | 18 | 43 | 68 | 93 | 22 | 47 |
| 9 | 72 | 1 | 26 | 51 | 76 | 5 | 30 | 55 |
| 10 | 80 | 9 | 34 | 59 | 84 | 13 | 38 | 63 |
| 11 | 88 | 17 | 42 | 67 | 92 | 21 | 46 | 71 |
| 12 | 0 | 25 | 30 | 75 | 4 | 29 | 54 | 79 |
| 13 | 8 | 33 | 58 | 83 | 12 | 37 | 62 | 87 |
| 14 | 16 | 41 | 66 | 91 | 20 | 45 | 70 | 95 |
| 15 | 24 | 49 | 74 | 3 | 28 | 53 | 78 | 7 |
| 16 | 32 | 57 | 82 | 11 | 36 | 61 | 86 | 15 |
| 17 | 40 | 65 | 90 | 19 | 44 | 69 | 94 | 23 |
| 18 | 48 | 73 | 2 | 27 | 52 | 77 | 6 | 31 |
| 19 | 56 | 81 | 10 | 35 | 60 | 85 | 14 | 39 |
| 20 | 64 | 89 | 18 | 43 | 68 | 93 | 22 | 47 |
| 21 | 72 | 1 | 26 | 51 | 76 | 5 | 30 | 55 |
| 22 | 80 | 9 | 34 | 59 | 84 | 13 | 38 | 63 |
| 23 | 88 | 17 | 42 | 67 | 92 | 21 | 46 | 71 |
| 24 | 0 | 25 | 50 | 75 | 4 | 29 | 54 | 79 |
| 25 | 8 | 33 | 58 | 83 | 12 | 37 | 62 | 87 |

REPEATS FROM HERE → (row 12)

TECHNIQUES FOR INPUT FORMATTING AND COEFFICIENT SELECTION FOR SAMPLE RATE CONVERTER IN PARALLEL IMPLEMENTATION SCHEME

FIELD OF THE DISCLOSURE

This disclosure relates generally to the field of sample rate converters ("SRCs") and, more particularly, to techniques for efficient input formatting and selection of coefficients for SRCs in a parallel implementation scheme.

BACKGROUND

The process of changing the sampling rate of a discrete signal to obtain a new discrete representation of the underlying continuous signal is referred to as "sample rate conversion." Common applications of sample rate conversion include audio/visual ("A/V") systems and image scaling, for example, where different sampling rates may be used for a variety of historical, engineering, and/or economic reasons. For example, television and film use different sampling rates, as do compact disc ("CD") audio systems and digital audio tape ("DAT") systems. Sample rate conversion techniques prevent changes in pitch and speed that might otherwise occur during transfer of recorded material between systems that employ different sampling rates.

Sample rate conversion may also include or be referred to as sampling-frequency conversion, resampling, up sampling, down sampling, interpolation, decimation, upscaling, downscaling; "multi-rate digital signal processing" is sometimes used to refer to systems that incorporate sample rate conversion.

Implementation of an SRC in a parallel scheme involves obtaining the input samples as required by a rate conversion factor at an output clock rate for filter operations in each parallel line. Such an implementation of an SRC also involves obtaining the required coefficients for each parallel line as required by the rate conversion factor.

SUMMARY OF THE DISCLOSURE

One embodiment is a sample rate converter ("SRC") for implementing a rate conversion L/M wherein data is input to the SRC at an input rate ("$F_{in}$") and output from the SRC at an output rate ("$F_{out}$") equal to $F_{in}*L/M$. The SRC includes a low pass filter ("LPF") including P multiply-add instances, wherein P is a parallelization factor of the SRC; an input formatter for arranging samples received at the SRC in accordance with the rate conversion L/M and providing $P*T_{pp}$ input samples to the filter at a given time, wherein $T_{pp}$ is a number of taps per phase of the LPF; and a coefficient bank for storing a plurality of coefficients and for providing $P*T_{pp}$ of the coefficients to the LPF at a given time.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 7 is a flow diagram illustrating operation of an input formatter portion of an SRC in which techniques for efficient input formatting and coefficient selection may be implemented in accordance with embodiments described herein;

FIGS. 8A and 8B are block diagrams illustrating a "Write-Lead/Read-Lag" scheme for use in an SRC in which techniques for efficient input formatting and coefficient selection may be implemented in accordance with embodiments described herein and illustrated using an example set of parameters;

FIGS. 11 and 12 respectively illustrate example coefficient set tables for an SRC in which techniques for efficient input formatting and coefficient selection may be implemented in accordance with embodiments described herein and illustrated using an example set of parameters.

DETAILED DESCRIPTION OF EXAMPLE EMBODIMENTS

Figure 1:
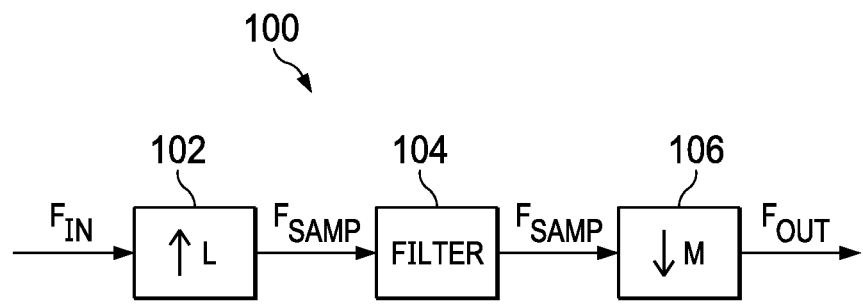
FIG. 1 is a simplified block diagram illustrating a sample rate converter ("SRC") in which techniques for efficient input formatting and coefficient selection may be implemented in accordance with embodiments described herein.

FIG. 1 is a simplified block diagram illustrating an SRC 100 in accordance with embodiments described herein. As shown in FIG. 1, the SRC 100 includes an interpolator 102, which upsamples an input signal sampled at an input rate $F_{in}$ by a factor of L, a lowpass filter 104, which may have a normalized cutoff frequency of rift, and a decimator 106, which downsamples a signal output from the filter 104 at a sample rate $F_{samp}$, which is equal to $L*F_{in}$, by a factor of 1/M. As illustrated in FIG. 1, the LPF 104 will need to remove both images and aliases. In the case where M>L and the output sample rate is lower than the input sample rate, the filter cutoff would be Fs/M because the filter must be narrower to reject aliases.

Accordingly, the SRC 100 implements a rate conversion R, which is a real number, on a digital signal having an input rate $F_{in}$ such the output rate $F_{out}$ of the signal is $F_{in}*R$. The rate conversion R can be expressed as a fraction L/M, and conceptually it is realized as Interpolation→Filter→Decimation as shown in FIG. 1. This form of SRC is not implemented as such in hardware, instead it is implemented through a scheme or arrangement commonly referred to as "polyphase implementation," as illustrated and described in greater detail below.

In a polyphase implementation of an SRC, such as SRC 100, the upsampler 102 places L−1 zero-valued samples between adjacent samples of the input data, designated herein as x(n), and increases the sample rate by a factor of L. Hence, the filter 104 is placed at the part of the system that has a higher sample rate. The rate conversion R may be a rational or irrational number and, in either case, may be represented exactly or approximated as a fraction L/M, as indicated above. For an irrational numeric value of R, L/M would closely match the actual value based on the precision of L and M. In view of the foregoing, R and L/M are used interchangeably herein.

As previously noted, a polyphase structure is an efficient way of implementing an SRC in hardware, in terms of computational efficiency. A brief introduction to a polyphase arrangement for implementing an SRC is provided below with reference to FIG. 2. In particular, FIG. 2 illustrates a conceptual polyphase arrangement for implementing an SRC 200.

Figure 2:
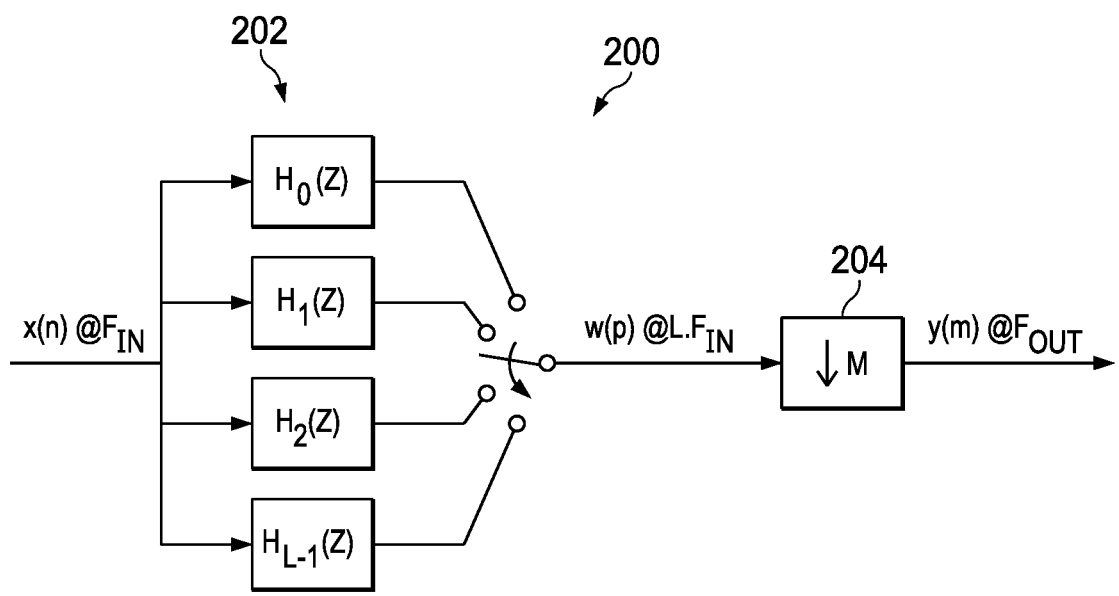
FIG. 2 is a simplified block diagram illustrating a conceptual polyphase implementation of an SRC in which techniques for efficient input formatting and coefficient selection may be implemented in accordance with embodiments described herein.

Referring to FIG. 2, a first stage 202 of the SRC 200 implements upsampling, or interpolation, of input samples x(n) by L using a polyphase structure in which the interpolator output rate is $L*F_{in}$ thus avoiding unnecessary computations with 0s. Each of the filters shown in FIG. 2 only computes with non-zero input samples, such that only one of the filters produces an output at any given time. The first stage 202 is followed by a decimator 204, which decimates the rate of the samples output from the first stage 202 by M, meaning that M−1 samples from the first stage 202 are discarded for every M output samples. Accordingly, only one sample out of every M samples from the first stage 202 is required to be computed. As a result, the polyphase scheme as illustrated in FIG. 2 may be simplified to that shown in FIG. 3.

Figure 3:
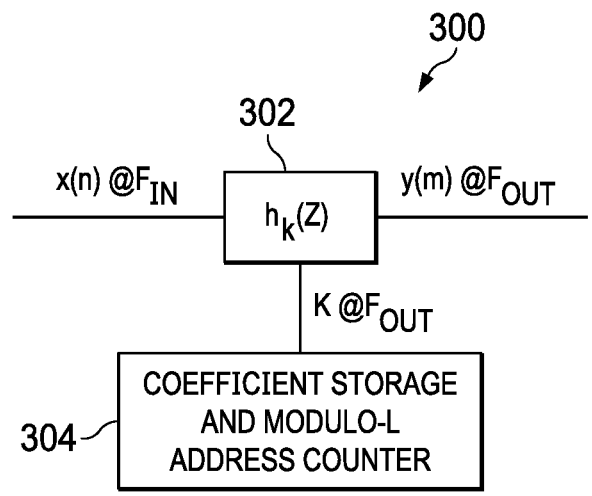
FIG. 3 is a more simplified block diagram illustrating a conventional polyphase implementation of the SRC of FIG. 2 in which techniques for coefficient selection may be implemented in accordance with embodiments described herein.

As shown in FIG. 3, a conventional polyphase implementation of an SRC 300 avoids unnecessary computations with 0s and further avoids computing outputs at the interpolation stage that are destined to be discarded at the decimation stage. Moreover, the operating frequency of the filter is $F_{in}*L/M$, rather than $F_{in}*L$. As shown in FIG. 3, a filter 302 receives the input signal x(n) at a frequency $F_{in}$ and receives coefficients k from a coefficient bank 304 at frequency $F_{out}$ and generates an output (i.e., rate converted) signal y(m) at frequency $F_{out}$. Each set of coefficients corresponds to one of the L sets of coefficients for the filters in FIG. 2.

Figure 4:
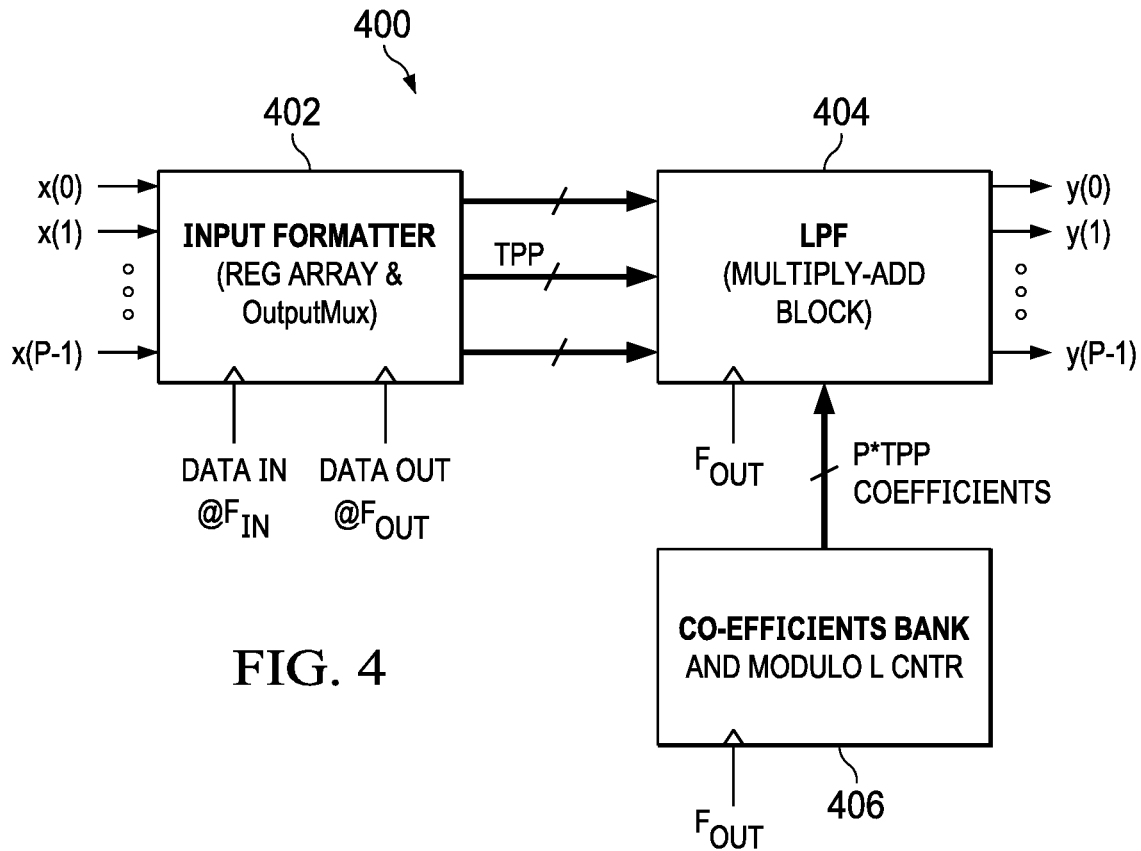
FIG. 4 is a high-level block diagram illustrating hardware implementation details for an SRC having a parallel implementation structure in which techniques for efficient input formatting and coefficient selection may be implemented in accordance with embodiments described herein.

FIG. 4 illustrates a high-level block diagram of an SRC 400 having a parallel implementation structure and that may implement efficient input formatting and coefficient selection in accordance with embodiments described herein. In general, the parallel implementation structure is used because sample rates are so high that it is difficult to implement a filter directly; rather, they are broken into parallel sections computed at a lower rate. As shown, this rate is P times lower than the input and output sample rates. In general, the parallelization factor P could be different for the input and the output. Referring again to FIG. 4, as shown therein, P input data samples x(n) are clocked into an input formatter 402 at a frequency $F_{in}$ and $P*T_{pp}$ filter input samples (where $T_{pp}$ is a number of filter taps per phase) are output from the input formatter, as described below, and provided to a low pass filter ("LPF") 404 at a frequency $F_{out}$. The LPF 404 receives the $P*T_{pp}$ samples from the input formatter 402 as well as $P*T_{pp}$ coefficients from a coefficients bank 406 at a frequency $F_{out}$ and outputs P data samples y(n) at a frequency $F_{out}$.

Figure 5A:
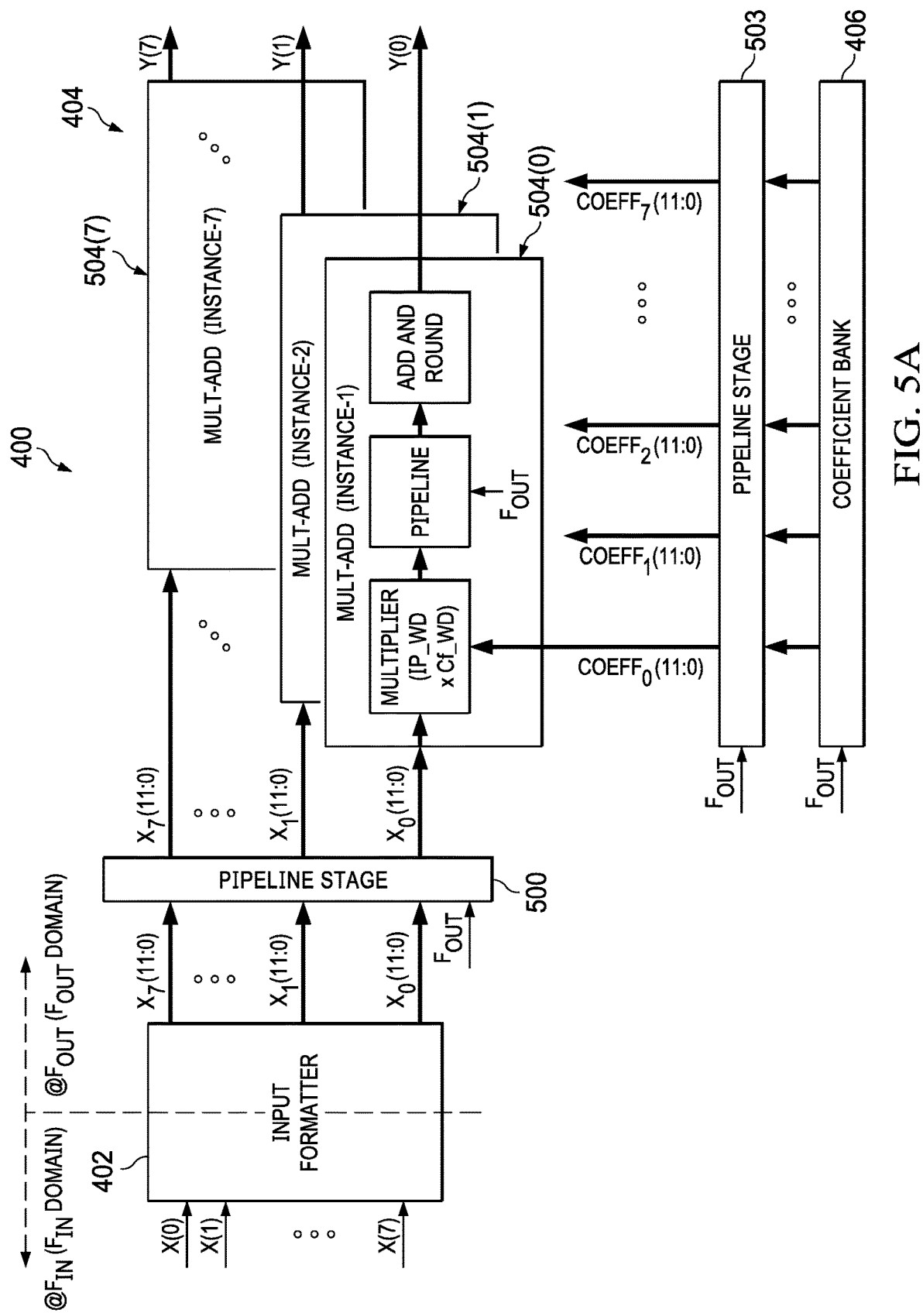
FIG. 5A is a more detailed representation of the SRC of FIG. 4 in which techniques for efficient input formatting and coefficient selection may be implemented in accordance with embodiments described herein and illustrated using an example set of parameters.
Figure 5B:
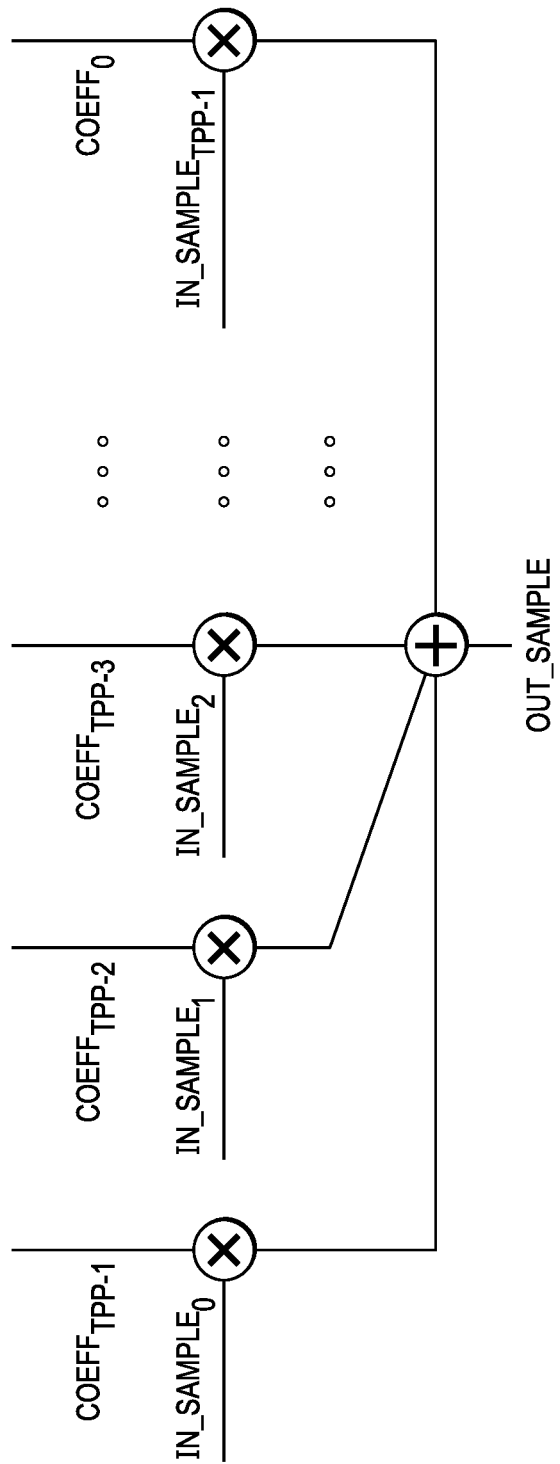
FIG. 5B illustrates a sum of products ("SOP") operation implemented by mult-add instances of the SRC of FIG. 4.

FIG. 5A illustrates a more detailed block diagram of the SRC 400 of FIG. 4 in which P is equal to 8. As shown in FIG. 5A, the input formatter 402 receives 8 input samples x(0)-x(7) at a frequency $F_{in}$ and outputs $P*T_{pp}$ samples $x_0(11,0)$-$x_7(11,0)$ at a frequency $F_{out}$ to a pipeline stage 500, which is clocked at $F_{out}$ and forwards each of the $T_{pp}$ filter inputs to a respective one of P multiplication/addition instances 504 (0)-504(7). Additionally, P*12 coefficients $COEFF_0(11,0)$-$COEFF_7(11,0)$ (each of which have a finite bit width) from coefficient bank 406 are input to a respective one of the instances 504(0)-504(7) of the LPF 404 via a second pipeline stage 504 at a frequency $F_{out}$. Each of the instances 504(0)-504(7) implements a sum of products ("SOP") of data samples and coefficients, as illustrated in FIG. 5B. P data output samples y(0)-y(7) are output from the instances 504(0)-504(7) at a frequency $F_{out}$.

In summary, the parallel implementation approach shown in FIG. 5A, in which output samples are computed in parallel with each processing unit running at a lower frequency, enables achievement of better area and power metrics. In accordance with features of embodiments described herein, several techniques are proposed for improving the efficiency of the current parallel implementation scheme. Such techniques may include implementation of a more efficient input formatter (such as input formatter 402) as well as more efficient coefficient selection (e.g., from coefficient bank 406), as will be described in greater detail below.

As discussed above, SRC implements a rate conversion L/M with an input rate of $F_{in}$, and an output rate of $F_{out}=F_{in}*(L/M)$. This poses a number of challenges for the inputs arriving at the $F_{in}$ rate. One such challenge concerns input formatting. In particular, inputs have to be efficiently "arranged" for filter operations as governed by L/M and P for the parallel implementation scheme. Another such challenge relates to timing isolation. Specifically, inputs have to be rate converted to the $F_{out}$ rate before they are forwarded to the filter to avoid direct timing paths between $F_{in}$ and $F_{out}$. In particular, $F_{in}$ and $F_{out}$ can be of different frequencies governed by the L and M ratio. When there is a direct interaction between $F_{in}$ domain signals and $F_{out}$ domain signals, the interaction may result in a very high frequency crossing, causing an extremely difficult path for which to meet timing requirements. The input formatter intentionally avoids or isolates the timing paths between $F_{in}$ and $F_{out}$ domains for this reason.

A "variable input offsets" concept in accordance with embodiments described herein may be used to address this issue. In particular, unlike fixed decimation and interpolation, the index of inputs required in successive $F_{out}$ cycles for SRC filter operations is based on L/M. The input index required to generate the output sample identified by the $m^{th}$ output index is given by:

INT(*m*M/L*)

where m is the output sample index, and the offset between two successive input indices for the $m^{th}$ output and the $(m+1)^{th}$ output (i.e., the input index offset) is given by:

INT((*m*+1)*M/L*)−INT(*m*M/L*)

Tables 1 and 2 below illustrate the variable input offsets concept for L/M=4/5 and L/M=8/21, respectively. In each of Table 1 and Table 2, a first row identifies the output sample index (m), a second row identifies the input sample index corresponding to the output sample index of the same column (INT(m*M/L)), and a third row identifies the input index offset corresponding to the output sample index and input sample index of the same column (INT ((m+1)*M/L) INT (m*M/L)).

TABLE 1

(L/M = 4/5)

| Output Sample Index | 0 | 1 | 2 | 3 | 4 | 5 | 6 | 7 | 8 | 9 | 10 | 11 | 12 |
|---|---|---|---|---|---|---|---|---|---|---|---|---|---|
| Input Sample Index | 0 | 1 | 2 | 3 | 5 | 6 | 7 | 8 | 10 | 11 | 12 | 13 | 15 |
| Input Index Offset | 1 | 1 | 1 | 2 | 1 | 1 | 1 | 2 | 1 | 1 | 1 | 2 | 1 |

TABLE 2

(L/M = 8/21)

| Output Sample Index | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| Input Sample Index | 0 | 2 | 5 | 7 | 10 | 13 | 15 | 18 | 21 | 23 | 26 | 28 | 31 | 34 | 36 |
| Input Index Offset | 2 | 3 | 2 | 3 | 3 | 2 | 3 | 3 | 2 | 3 | 2 | 3 | 3 | 2 | 3 |

As illustrated in the above tables, the input sample indices and the successive input index offsets are not fixed and vary with time based on the ratio of L to M. In the following section, conventional direct implementation of input formatter is compared against the techniques described herein for efficient input formatting.

In a parallel implementation scheme, in which samples are processed in parallel, a method for efficiently formatting the inputs in accordance with embodiments described herein is illustrated and explained with reference to a particular example illustrated in FIG. 6A. It should be noted that the below-represented values are presented for purposes of illustration and example only and are not hardcoded. The values could be either parameterized or programmable and in general are variables. In the example embodiment:

Parallelization Factor (Parallel Output Computation) ("P"): 8
Number of Filter Taps per Phase ("$T_{pp}$"): 12 (parameterized or adaptive)
Input Data Width: 16 (parameterized)

Figure 6A:
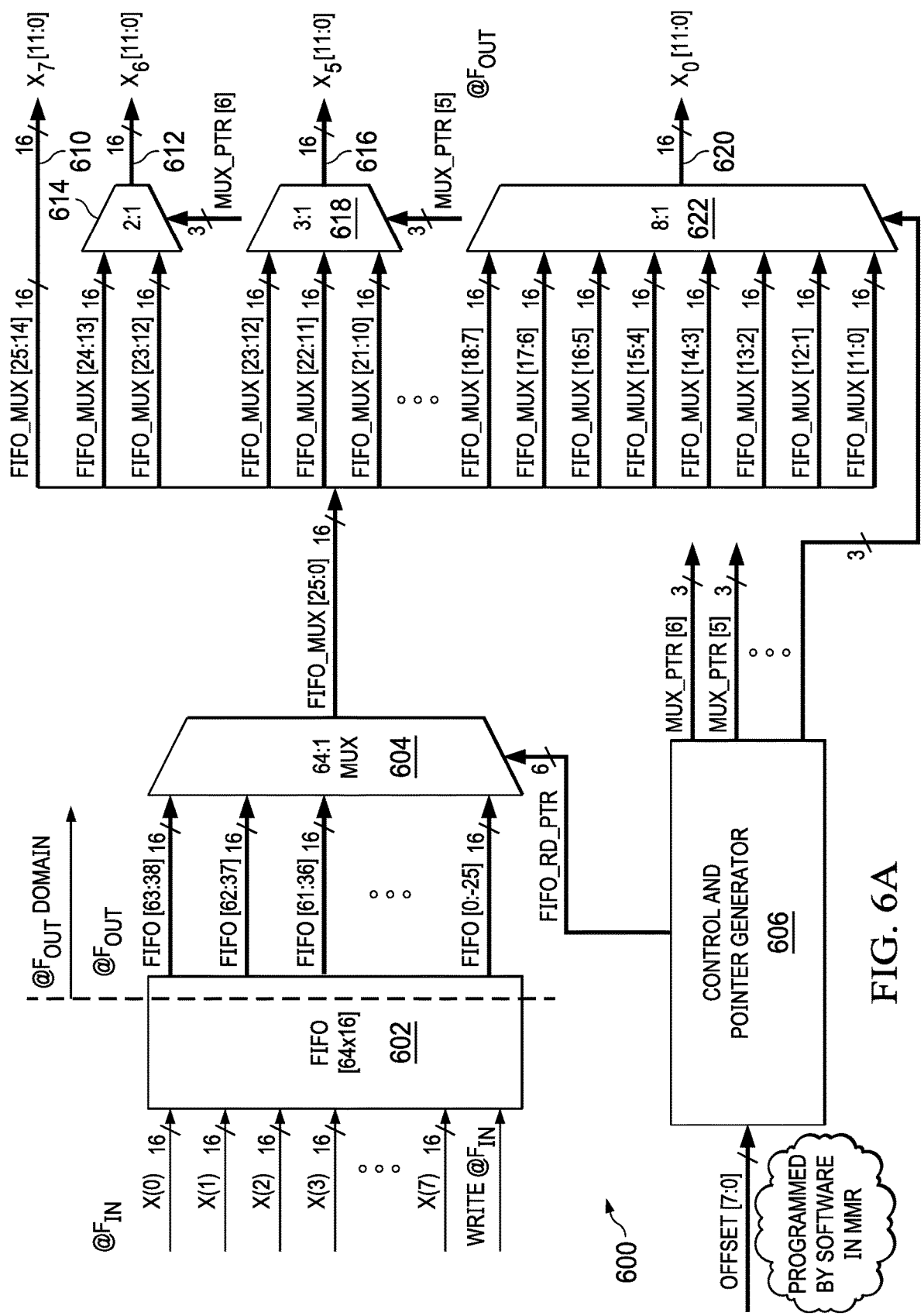
FIG. 6A is a schematic block diagram illustrating an input formatter portion of an SRC in which techniques for efficient input formatting and coefficient selection may be implemented in accordance with embodiments described herein and illustrated using an example set of parameters.

In a specific implementation of an input formatter 600 represented in FIG. 6A, a set of 8 parallel input samples (x(0)-x(7)) are written to a 64×16 FIFO 602 during a single $F_{in}$ clock cycle. A set of input samples is read out of FIFO 602 and into a 64:1 MUX 604 on the next $F_{out}$ cycle. Offset values, which may be programmed by software, are input to a control and pointer generator 606, which generates a FIFO_RD_PTR to a select input of the 64:1 MUX 604 to control which set of input samples is output from the MUX 604 as FIFO_MUX. Input samples are read from the FIFO 602 based on the input index governed by the offset values. For example, if current input index is 23, the inputs read would be X(23), X(22), X(21), . . . X(12).

In an unoptimized structure, a set of 12 samples is required to be read from the FIFO to generate one output (because $T_{pp}$=12). In other words, 12 ($T_{pp}$) input samples are required for each and every parallel line; on the whole, 96 (i.e., 8*12) samples are read from the FIFO, based on eight offset values. If N is the depth of the FIFO, then 96*16 N:1 MUXes are required to read 96 samples as described above. Implementing such a large number of MUXes results in an enormous area cost and huge congestion issues are incurred in backend implementation (i.e., Physical Design/Place and Route).

Area efficient implementation for input formatting and avoidance of a direct timing path between $F_{in}$ and $F_{out}$ in accordance with embodiments described herein will now be explained. It will be recognized that the total number of "unique" samples $N_{uniq}$ required to cater to P parallel lines (for generating P output samples) is defined by:

$$N_{uniq}=(P-1)*\text{ceil}(M/L)+T_{pp}$$

for ceil (M/L)<$T_{pp}$.

SRC may perform a rate conversion R in the range of 0.5 to 1 or effective decimation between 1 and 2. This facilitates an implementation of an input formatter that results in a huge area gain and congestion reduction. The same technique can be applied for any effective decimation less than $T_{pp}$. In the case of $(M/L)_{max}$ equal to 2, based on DDC architecture, $N_{uniq}$ is 26. Accordingly, in a given $F_{out}$ cycle, only 26 unique samples are read from the FIFO and from that, 96 samples can be "arranged," as dictated by L/M. As shown in FIG. 6A, FIFO_MUX [25:0] are the 26 unique samples read from a 64 deep FIFO (e.g., FIFO 602), with the read pointer pointing to $7^{th}$ sample (P-1) in a given $F_{out}$ cycle, as determined by offsets. FIFO size determination is discussed below. From the 26 samples, 96 samples are generated and arranged, again based on offsets.

Figure 6B:
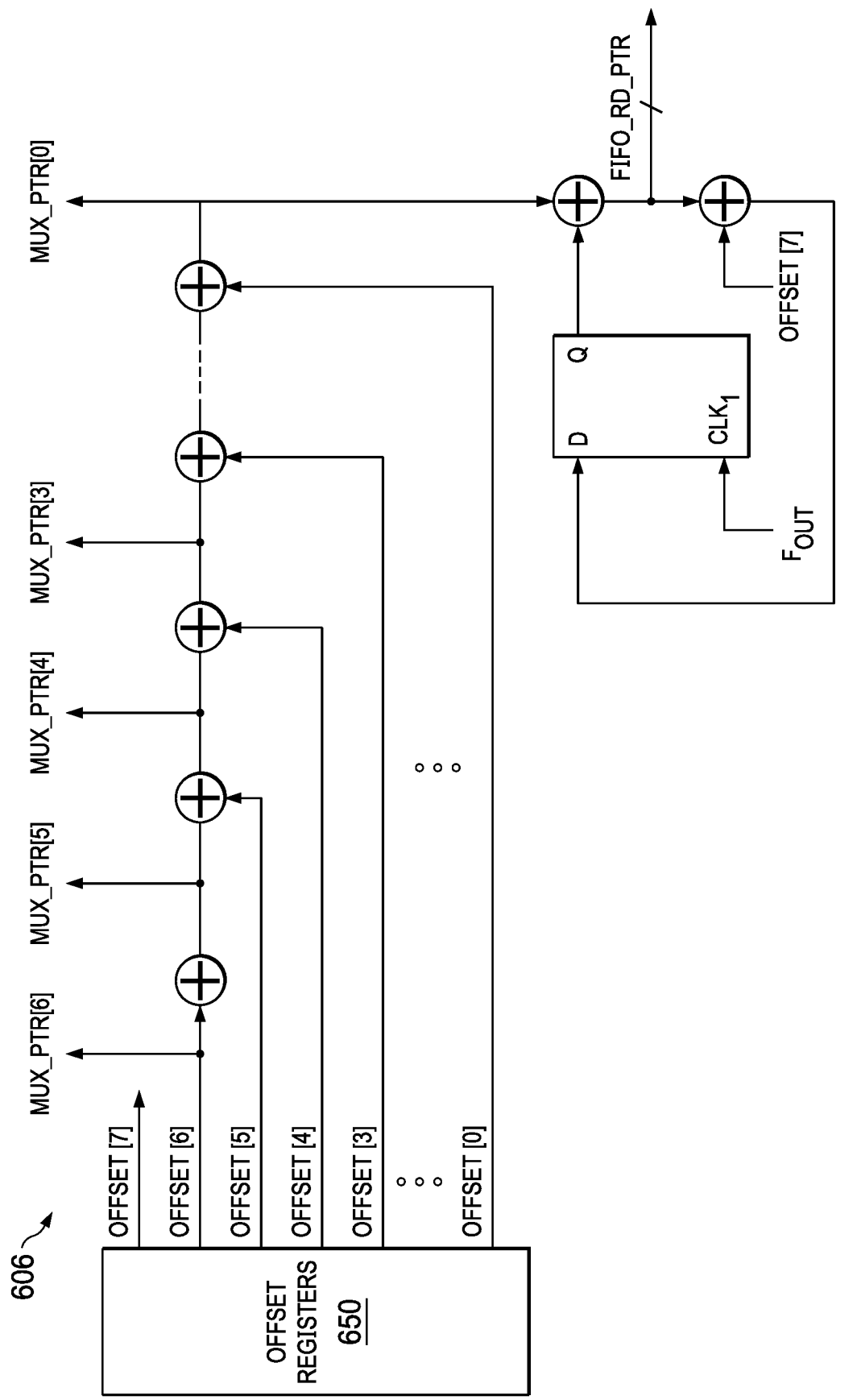
FIG. 6B is a schematic block diagram of a pointer generator for use in an input formatter portion of an SRC in which techniques for efficient input formatting and coefficient selection may be implemented in accordance with embodiments described herein and illustrated using an example set of parameters.

As will be further described with reference to FIG. 6B, offset registers disposed within the control and pointer generator 606 store the offset (programmable or hardware generated) between successive input indices based on L/M, as described above with reference to Tables 1 and 2. FIG. 6B is a block diagram of exemplary hardware for implementing the control and pointer generator 606 for generating a FIFO read pointer ("FIFO_RD_PTR") and MUX select lines ("MUX_PTRs") using a plurality of offset registers 650 in which, as noted above, the offsets are stored. In the direct implementation method, P FIFO_RD_PTRs have to be generated for reading the samples, whereas in embodiments described herein, only one FIFO_RD_PTR has to be generated; the other pointers are MUX_PTRs.

As used herein, "P" is the number of parallel samples (or parallel paths) required, "$T_{pp}$" is the number of taps per phase (or the order of the filter), L/M is the resampling ratio (interpolator/decimator), "R" is equal to ceil(M/L) (i.e., the smallest integer not less than M/L), "$F_{in}$" is the input clock rate, and "$F_{out}$" is the output clock rate. In general, the functionality of the input formatter is to arrange and provide the required samples to P "mult-add" blocks, or instances, for filtering operations. The input formatter takes P samples at $F_{in}$, stores them, and outputs $P*T_{pp}$ samples at $F_{out}$ as required for P mult-add blocks. Each mult-add block needs $T_{pp}$ samples to produce one output; therefore $P*T_{pp}$ samples are required for P blocks to produce P output. Samples driven by the input formatter to a mult-add block are governed by the resampling ratio; the sample arrangement changes depending on the value of L/M. As will be explained in greater detail below, embodiments described herein efficiently provide $P*T_{pp}$ samples to each mult-add block.

In particular, P input samples are written to a custom FIFO at every $F_{in}$ clock cycle. The custom FIFO has P write lines. It will be recognized that, although $P*T_{pp}$ samples are required to be given out, all of them may not be unique. As noted above, the total number of samples required for P mult-add blocks is $N_{uniq}$. $N_{uniq}$ samples are read from the FIFO at every $F_{out}$ clock cycle. The FIFO has $N_{uniq}$ read lines. In cases in which M/L<$T_{pp}$, $N_{uniq}$ will be less than $P*T_{pp}$; therefore, the number of samples required to be read from the FIFO will be less than $P*T_{pp}$. For closer L and M values, $N_{uniq}$ is much less than $P*T_{pp}$, reducing the MUXing complexity to a large extent. From $N_{uniq}$ samples, $P*T_{pp}$ samples are generated through another level of MUXing, again governed by L/M.

Table 1 below represents how the samples are arranged/selected for P parallel lines once $N_{uniq}$ samples are read from the FIFO.

computed and kept in the hardware from which selects are generated. The offsets are repeated after every L cycles. From Table 1, it will be noted that no MUX select is needed for the first line (P-1), the offset of the second line (P-2) is used as the MUX select for the second line, the offset of the second line (P-2) plus the offset of the third line (P-3) is used as the MUX select for the third line, the offset of the second line (P-2) plus the offset of the third line (P-3) plus the offset of the fourth line (P-4) is used as the MUX select for the fourth line, and so on. Offset(P-1)+offset(0)+FIFO current read pointer gives the read pointer for the next cycle to fetch the next set of $N_{uniq}$ samples from the FIFO. The above steps are repeated for every $F_{out}$ cycle.

The hardware cost for reading 26 unique samples from a 64 deep FIFO is 26*16 64:1 MUXes as compared to 96*16 64:1 MUXes in the direct implementation method. If X is assumed to be an area cost for 16 64:1 MUXes, the direct method incurs an area cost of 96X and current proposal would incur a cost of 26X. The additional cost of generating 96 samples from 26 samples is much less for the following reasons. Referring again to FIG. 6A, a set of input samples FIFO_MUX [25:14] are directly input to the LPF (e.g., LPF 404 (FIG. 4)), for parallel line number 7, designated in FIG. 6A by a reference numeral 610. As M/L varies between 1 and 2, the next set of input samples for parallel line number 6, designated in FIG. 6A by a reference numeral 612, will have an offset of 1 or 2 from parallel line number 7 610, which may be implemented using a 2:1 MUX 614 between

TABLE 1

| Parallel Line Index | Sample Start Index from $N_{uniq}$ | Number of Start Indices Possible | Length of Samples | Input Samples Set (in each line one of the sets is selected) |
|---|---|---|---|---|
| P-1 | 0 | 1 | $T_{pp}$ | {0, 1, 2, . . . until $T_{pp}$ Samples} |
| P-2 | 1 or 2 or . . . Until R | R | $T_{pp}$ | {1, 2, 3 . . . until $T_{pp}$ Samples} or {2, 3, 4 . . . until $T_{pp}$ Samples} or . . . until {R, R + 1, R + 2, . . . until $T_{pp}$ Samples} |
| P-3 | 2 or 3 or . . . Until 2R | 2R-1 | $T_{pp}$ | {2, 3, 4 . . . until $T_{pp}$ Samples} or {3, 4, 5 . . . until $T_{pp}$ Samples} or . . . until {2R, 2R + 1, 2R + 2, . . . until $T_{pp}$ Samples} |
| P-4 | 3 or 4 or . . . Until 3R | 3R-2 | $T_{pp}$ | {3, 4, 5, . . . until $T_{pp}$ Samples} or {4, 5, 6, . . . until $T_{pp}$ Samples} or . . . until {3R, 3R + 1, 3R + 2, . . . until $T_{pp}$ Samples} |
| P-5 | 4 or 5 or . . . Until 4R | 4R-3 | $T_{pp}$ | {4, 5, 6, . . . until $T_{pp}$ Samples} or {5, 6, 7, . . . until $T_{pp}$ Samples} or . . . until {4R, 4R + 1, 4R + 2, . . . until $T_{pp}$ Samples} |
| . . . | . . . | . . . | . . . | . . . |
| . . . | . . . | . . . | . . . | . . . |
| 0 | P or P-1 or . . . until PR | PR-P + 1 | $T_{pp}$ | {P, P + 1, P + 2, . . . until $T_{pp}$ Samples} or {P + 1, P + 2, P + 3, . . . until $T_{pp}$ Samples} or . . . until {PR, PR + 1, PR + 2, . . . until $T_{pp}$ Samples} |

Referring to Table 1 above, it will be noted that the first line (P-1) does not require any MUX, the second line (P-2) requires an R:1 MUX (for each of $T_{pp}$ samples), the third line (P-3) requires a (3R-2):1 MUX, the fourth line (P-4) requires a (4R-3):1 MUX, and so on. Accordingly, for smaller values of R, the MUXing complexity is much less. For each parallel line, the sample start index is found form L and M and is the MUX select for the above-noted MUXes. The input sample offset between successive output samples is given by INT((m+1)R)−INT(mR), where m is the output index and M+1 is the next output index. These offsets are input samples FIFO_MUX [24:13] and FIFO_MUX [23:12]. For line number 5, designated in FIG. 6A by a reference numeral 616, there will be an offset of 2 to 4 from line number 7 610, which may be implemented using a 3:1 MUX 618.

Similarly, for line number 4 (not shown), input samples will have an offset of 3 to 6 from line number 7 610, which may be implemented using a 4:1 MUX (not shown). This pattern continues through line number 8, designated in FIG. 6A by a reference numeral 620, input samples will have an offset of 7 to 14 from line number 7, which may be implemented using an 8:1 MUX 622. If the effective decimation M/L is equal to 2, the offset for line number 7 will select FIFO MUX [18:7] and if the effective decimation M/L is equal to 1, the offset for line number 7 will select FIFO_MUX [11:0]. For any intermediate decimation, the MUX line between 7 and 14 will be selected as pointed to by the offset. The area cost incurred by these mux lines is:

12*16*[2:1+3:1+4:1+5:1+6:1+7:1+8:1 MUXes]

Or 6.25X. Thus, the total area cost in the scheme illustrated in FIG. 6A is 26X+6.25X, or 31.25X, as compared to 96X in the direct implementation method, resulting in a 67% area improvement of area cost as compared to the direct implementation method.

Apart from area, the direct implementation method incurs a huge routing congestion problem in backend implementation (Physical Design/Place and Route) due to the need for a large crossbar MUX and a large number of fanouts. Even with 50% utilization, heavy congestion may be observed. In the proposed method shown in FIG. 6A, congestion issue is completely resolved, allowing a 10% increase in utilization as well. The technique illustrated in FIG. 6A proves to be very efficient for an effective decimation value less than or equal to 2; however, the technique may be advantageously applied for any effective decimation value less than or equal to $T_{pp}$.

FIG. 7 is a flow diagram illustrating operation of an efficient input formatter (such as input formatters 402, 600) in accordance with certain embodiments described herein. Referring to FIG. 7, in step 700, the input formatter receives P samples on each $F_{in}$ cycle. In step 702, the P input samples are written to a storage module, such as a FIFO, at $F_{in}$. In step 704, $N_{uniq}$ samples are read from the FIFO at $F_{out}$ and in step 706 are used to generate $P*T_{pp}$ samples as dictated by L/M. Step 706 may be performed using a plurality of MUXing elements, as well as a control and pointer generator for generating a FIFO read pointer and MUX pointers for the plurality of MUXing elements (as shown and described with reference to FIGS. 6A and 6B). In step 708, the $P*T_{pp}$ samples are output to a filter module at $F_{out}$.

$F_{in}$-$F_{out}$ timing isolation and FIFO size determination in accordance with embodiments described herein will now be described in greater detail. In particular, direct timing paths between $F_{in}$ and $F_{out}$ could be of very high frequency (e.g., on the order of $F_{ADC}/4$) and filter operations should not fall in those paths. A scheme referred to as "Write-Lead/Read-Lag" is proposed to solve this timing path issue and is illustrated in FIGS. 8A and 8B with reference to a FIFO 800. Referring to FIG. 8A, in the Write-Lead/Read-Lag scheme, in a current ("nth") $F_{out}$ cycle, while a current portion 802 of the FIFO 800 is being written at input rate $F_{in}$, a previously written portion 804 of the FIFO is read at output rate $F_{out}$. In the next (n+1th) $F_{out}$ cycle illustrated in FIG. 8B, the write pointers move to a next portion 806 of the FIFO 800 to be written at input rate $F_{in}$ and a read is performed from the portion 802 of the FIFO where the write just occurred at output rate $F_{out}$. As a result, writes always lead reads by an $F_{out}$ cycle and this sequence repeats continuously. Multiple writes occur in a single $F_{out}$ cycle, as this SRC is an effective decimator. The Write-Lead/Read-Lag scheme described herein ensures that the FIFO portion that is read during a current $F_{out}$ cycle is not subsequently modified by $F_{in}$ writes.

The size of the FIFO 800 may be determined based on the above-described Write-Lead/Read-Lag scheme and is given by the following equation:

$$FIFO_{size}=2*P*ceil(M/L)+T_{pp}$$

for ceil $(M/L)<T_{pp}$.

P*ceil(M/L) new input samples are required to produce P samples. In this scheme, as write leads read by an $F_{out}$ cycle, extra space is required to store the write data, which is accounted for by the factor of 2. $T_{pp}$ is added to account for the order of the filter. In particular, to produce one output sample, $T_{pp}$ input samples are required. For effective decimation of M/L and parallel processing, $P*ceil(M/L)+T_{pp}$ samples are required to produce P samples. For example if M/L is 2, and P is 8 and $T_{pp}$ is 12, IN(1), IN(2), . . . IN(12) samples are required for the first output, IN(3), IN(4), . . . IN(14) samples are required for the second output, IN(5), IN(6), . . . IN(16) samples are required for the third output, and so on. On the whole 26 samples are required. This number is multiplied by 2 in the above equation, as read happens one cycle later than write.

It will be recognized that a polyphase implementation of an SRC requires appropriate coefficient selection for every phase, which selection is governed by L/M. A conceptual block diagram of a polyphase SRC structure has been described above with reference to FIG. 3. Efficient coefficient selection in accordance with embodiments described herein will be describe in detail in comparison with a direct implementation method. Coefficient selection using a direct, or "brute force" implementation results in a very high area cost. Assuming L is the number of phases implemented in an SRC, if $L_{max}$ is 96, the hardware should have 96 coefficient register ("coeff-reg") banks for storing coefficients corresponding to the 96 phases. On the whole, there will be 96 coefficient sets and the coefficients required for each phase in a given $F_{out}$ clock cycle should be selected from the space of 96 sets as dictated by L/M.

As used herein, $L_{max}$ is the maximum value allowed for L and $L_{allowed}$ corresponds to the allowed (or possible) values for L. In general, filter coefficients are organized into L phases, or banks, for L/M rate conversion and coefficients are programmed into the L banks. Each Fout clock cycle selects one of the L banks for filter operation, which is governed by the following equation:

$$coeff_{index}(i)=mod(i*M,L)$$

where i is the output sample index $F_{out}$ clock cycle and $coeff_{index}(i)$, points to coefficient set for $i^{th}$ output sample index. After L cycles, the pattern repeats, thus repeating the coefficient sets. For P parallel processing, P sets of coefficients are required to be forwarded to filter operations. As a result, $P*T_{pp}$ coefficients must be selected, thus requiring an $L_{max}$:1 MUX for each coefficient in each parallel line. In contrast, embodiments described herein efficiently selects $P*T_{pp}$ coefficients, thus reducing MUX complexity.

Figure 9A:
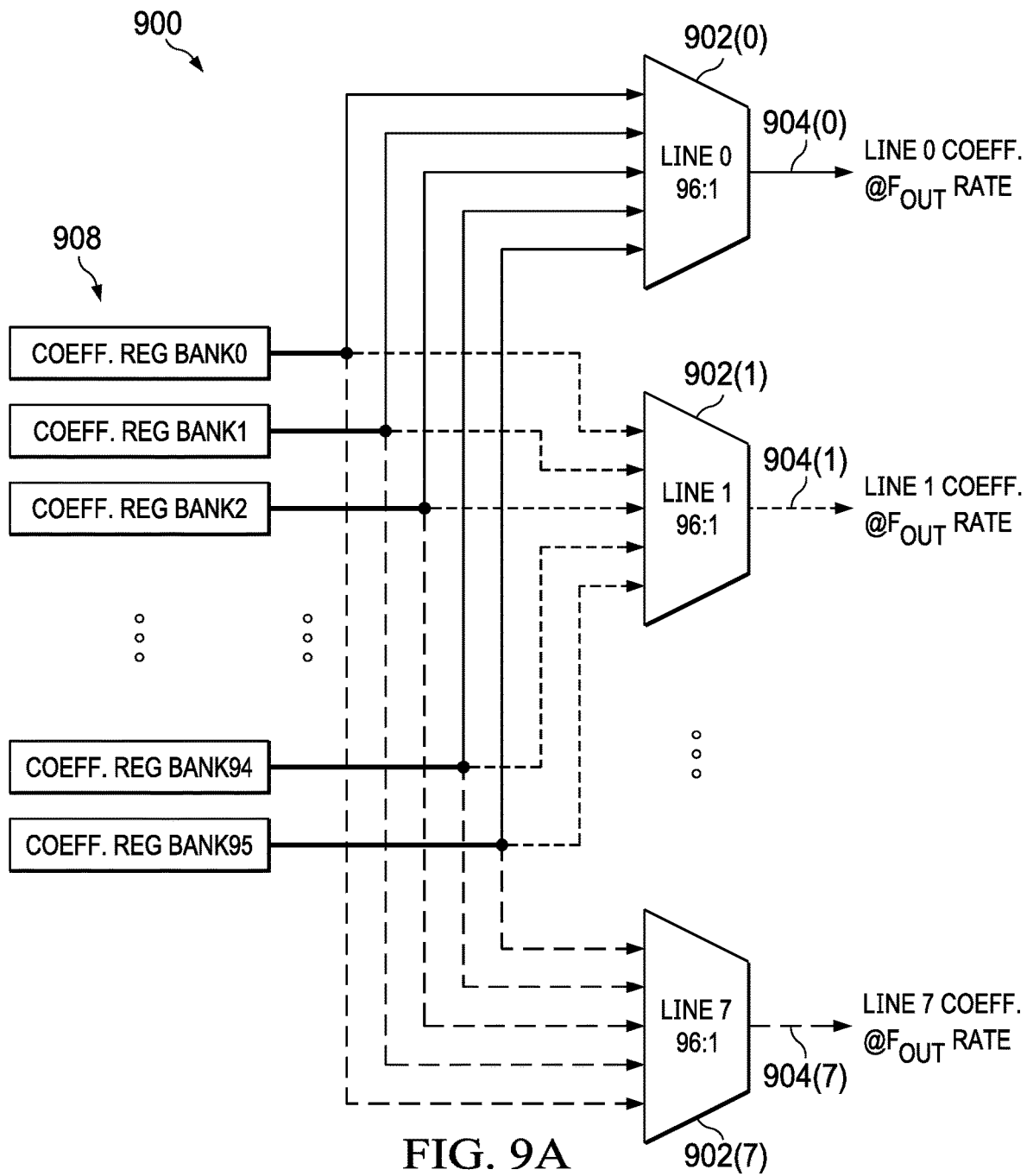
FIG. 9A is a schematic block diagram of a coefficient selection module for a direct implementation configuration of an SRC.

FIG. 9A illustrates an example of a direct, or "brute force," implementation of a coefficient selection module 900, in which coefficients are selected for 8 parallel lines (8 phases) 902(0)-902(7). In particular, as shown in FIG. 9A, each parallel line 902(0)-902(7) implements a 96:1 MUX 904(0)-904(7) and the total number of MUXes is 2208 (P*Coeff_BW*$T_{pp}$) 96:1 MUXes, where P (parallelization) is 8, Coeff_BW (coefficient bit width) is 23 and $T_{pp}$ is 12. In addition to MUXing complexity, fanout complexity also adds cost, with the same coefficient bit from each of a plurality of (i.e., 96) coefficient register ("coeff-reg"} banks 908 going to each of the eight MUXes 904(0)-904(7).

A more efficient coefficient selection module (e.g., for implementation as the coefficients bank 406 (FIG. 4)) in accordance with embodiments described herein will be described below with reference to FIG. 9B and is designated by a reference numeral 910. In general, in a polyphase single line (non-parallel) scheme, assuming L to be 96, the coefficients selected for a single line go through the entire set of 96 as given by the following equation (also noted above):

$$coeff_{index}(i)=mod(i*M,L)$$

where i is the output sample index $F_{out}$ clock cycle and $coeff_{index}(i)$, points to coefficient set for $i^{th}$ output sample index. As is evident from the above equation, when i crosses 95, the coefficient set repeats in the same fashion as 0-95. The coefficient sets are same for 0 to L−1, L to 2L−1, 2L to 3L−1, and so on.

In the parallel implementation scheme, assuming parallelization to be 8, in a given parallel line, coefficient sets do not span the entire space of coefficient banks (96, in the present example); rather, the number of sets spanned in a given parallel line is given by Max(L/P, 1) when L=$2^n$ (P–number of parallel samples) and by Max*L/P, 3) when L=$3*2^n$ (P–number of parallel samples).

Assuming $L_{max}$ equals 96 and P equals 8, the number of coefficient sets required to be spanned in a given parallel line is 12. This means that for a given parallel line, MUXing occurs only between 12 coefficient sets, rather than all 96 sets. This reduces the MUXing complexity by a factor of 8 over the direct implementation method 900 shown in FIG. 9A.

Figure 9B:
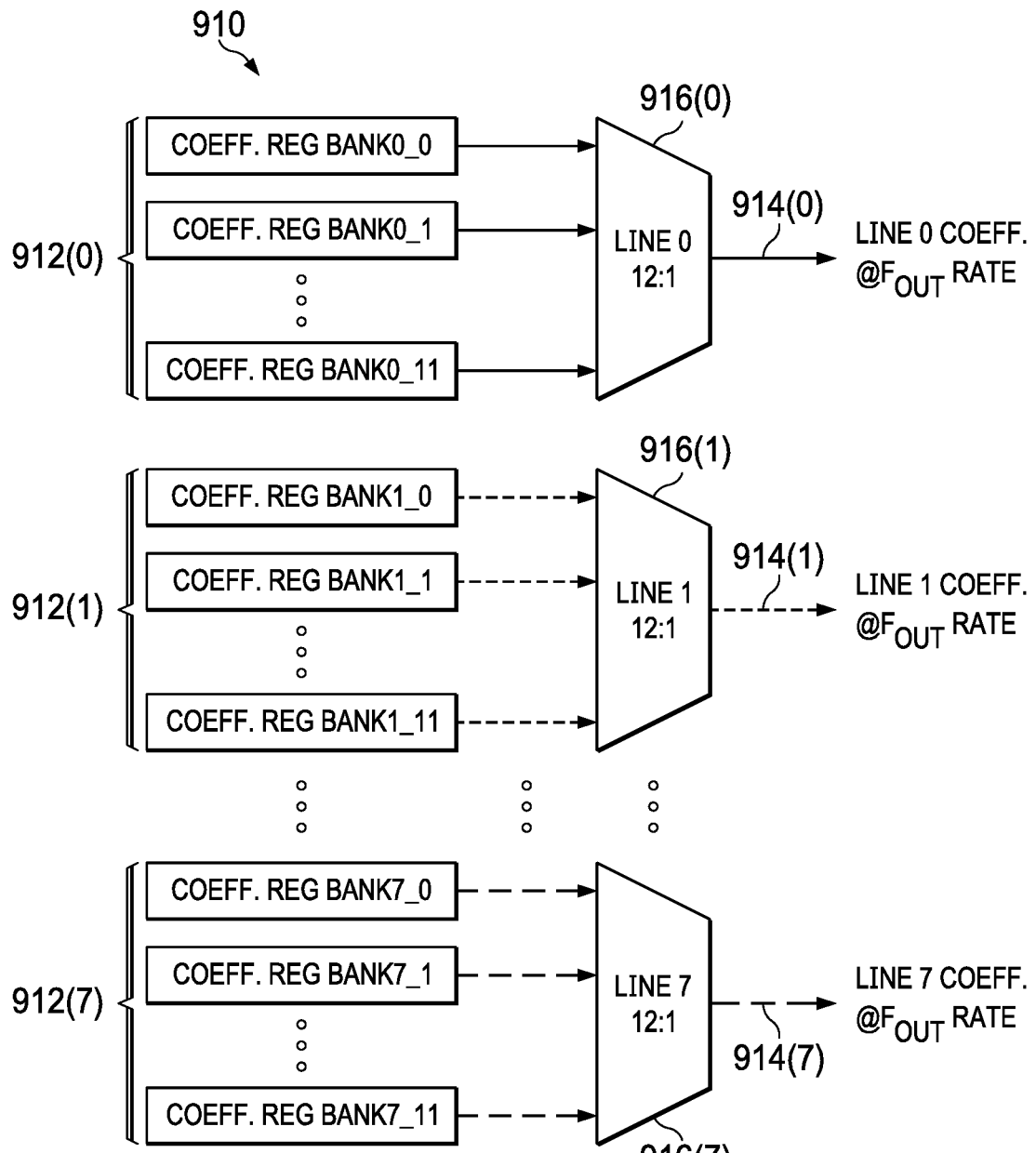
FIG. 9B is a schematic block diagram of a coefficient selection module for an SRC in which techniques for efficient input formatting and coefficient selection may be implemented in accordance with embodiments described herein and illustrated using an example set of parameters.

As shown in FIG. 9B, in the coefficient selection module 910, sets of 12 coefficient banks 912(0)-912(7) are dedicated for each line 914(0)-914(7); the banks 912(0)-912(7) are not shared across parallel lines 914(0)-914(7). Additionally, the 96:1 MUXes 902(0)-902(7) of the scheme 900 (FIG. 9A) are replaced in the scheme 910 by 12:1 MUXes 916(0)-916(7). In general, the method 910 applies for any L and P that satisfy the following requirements:

$$\mathrm{mod}(L_{max}, P) == 0 \qquad 1.$$

$$\mathrm{mod}(nL, P) == 0 \text{ and } nL/P \le L_{max} \qquad 2.$$

where n is the smallest possible integer. If the above conditions are satisfied, the number of coefficient banks required for each parallel line is $L_{max}/P$.

This scheme 910 works with assistance from software coefficient programming or pre-programmed banks of coefficient registers or hardware doing the same. As coefficient register banks are dedicated to the parallel lines, they must to be programmed as required by that line for a given L/M. Effectively they have to be programmed in a "shuffled" manner given by the following:

$$\mathrm{new}_{index}(i,j) = \mathrm{mod}[(iP+j)M, L]$$

and $$\mathrm{Coeff}_{rearranged}(i,j) = \mathrm{Coeff}_{original}(\mathrm{new}_{index}(i,j))$$

where i=0 to 11 and j=parallel line (0 to 7).

In general, an efficient coefficient selection scheme operates as follows. If $L_{max}/P$ is an integer and LCM ($L_{allowed}$, P)/P<$L_{max}/P$, then in a given parallel line, all of the L coefficient sets will not repeat, repetition is confined with in $L_{max}/P$ sets, and each parallel line will receive $L_{max}/P$ different coefficient sets. The repeating pattern depends on L and M. For each parallel line, $L_{max}/P$ banks, or phases, are dedicated and MUXing for each line is confined within those dedicated banks in the hardware. For example, $\mathrm{Bank}_0$ to $\mathrm{Bank}_{Lmax/P-1}$ are dedicated to Line 0, $\mathrm{Bank}_{Lmax/P}$ to $\mathrm{Bank}_{2Lmax/P-1}$ are dedicated to Line 1, $\mathrm{Bank}_{2Lmax/P}$ to $\mathrm{Bank}_{3Lmax/P-1}$ are dedicated to Line 2, and so on. $\mathrm{Bank}_{(P-1)Lmax/P}$ to $\mathrm{Bank}_{Lmax-1}$ are dedicated to Line P-1.

Coefficients are not programmed in an direct fashion; rather, they are programmed/sorted by the following equations:

$$\mathrm{new}_{index}(i,j) = \mathrm{mod}[(iP+j)M, L]$$

$$\mathrm{Coeff}_{rearranged}(i,j) = \mathrm{Coeff}_{original}(\mathrm{new}_{index}(i,j))$$

where i=0 to 11 and j=parallel line (0 to 7) in the specific example illustrated herein. $\mathrm{Coeff}_{original}$ has original assorted sets of coefficients, like $\mathrm{set}_0$, $\mathrm{set}_1$, $\mathrm{set}_2$, ... $\mathrm{set}_{L-1}$. $\mathrm{Coeff}_{rearranged}$ is shuffled as per the above equations and then programmed to $\mathrm{Bank}_0$, $\mathrm{Bank}_1$, $\mathrm{Bank}_2$, ... $\mathrm{Bank}_{L-1}$. The reshuffling of the coefficients ensures that for each line, appropriate $L_{max}/P$ sets are programmed in $L_{max}/P$ banks dedicated to them. This mechanism reduces the MUXing from Lmax:1 to $L_{max}/P$:1, reducing the complexity by a factor of P. The MUX select line is also optimized as follows. Mod(i*M/L) generator is not required, where i is the output sample index; a simple $L_{max}/P$ up counter or down counter is sufficient and round-robins $L_{max}/P$ banks for each line.

Figure 10:
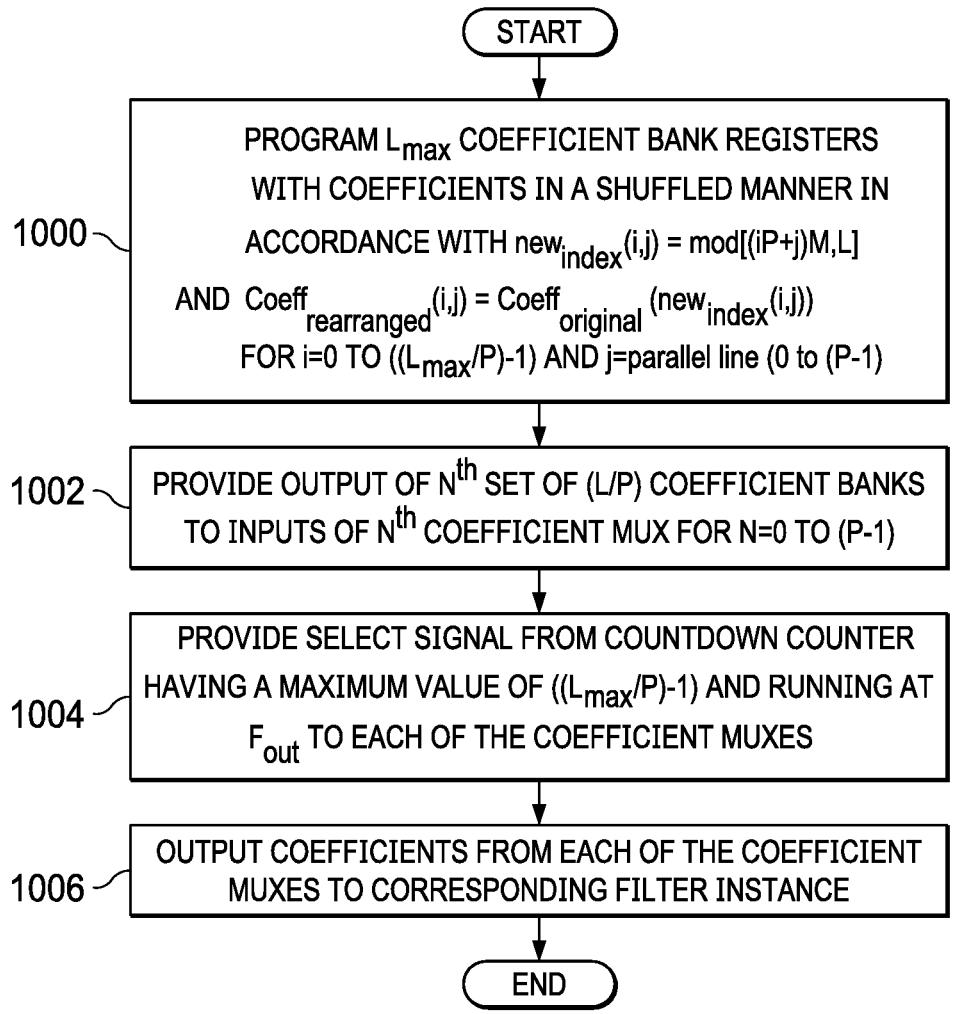
FIG. 10 is a flow diagram illustrating operation of a coefficient selection module for an SRC in which techniques for efficient input formatting and coefficient selection may be implemented in accordance with embodiments described herein.

FIG. 10 is a flow diagram illustrating operation of a coefficient selection module (such as modules 406, 910) for an SRC in which techniques for efficient input formatting and coefficient selection may be implemented in accordance with embodiments described herein. In step 1000, the coefficient bank registers are programmed in a shuffled manner as described above in accordance with the following equations:

$$\mathrm{new}_{index}(i,j) = \mathrm{mod}[(iP+j)M, L]$$

$$\mathrm{Coeff}_{rearranged}(i,j) = \mathrm{Coeff}_{original}(\mathrm{new}_{index}(i,j))$$

where i=0 to (($L_{max}/P$)-1) and j=parallel line (0 to (P-1)). In step 1002, the output of the Nth set of L/P (e.g., 12 in the example above) coefficient banks is provided to the inputs of the Nth coefficient MUX for N=0 to (P-1) (e.g., 7 in the example above). In step 1004, a select signal generated by a countdown counter having a maximum count of ($L_{max}/P$) 1 (e.g., 11 in the example above) and running at $F_{out}$ is provided to each of the coefficient MUXes. Finally, in step 1006, coefficients are output from each of the coefficient MUXes to a corresponding filter instance at $F_{out}$.

FIG. 11 illustrates an example coefficient set table 1100 for an example case in which L=96 and M=127. Each entry in the table 1100 indicates the coefficient set to be used for a given parallel line (indicated by the corresponding column index 1102) and given cycle number (indicated by the corresponding row index 1104). As shown in the table 1100, the coefficient sets repeats after the $12^{th}$ cycle ($F_{out}$ Cycle No. 11, $F_{out}$ Cycle No. 23, etc.). For example, coefficient set 56 is programmed in the second set ($F_{out}$ Cycle No. 1, $F_{out}$ Cycle No. 13, $F_{out}$ Cycle No. 25, etc.) of line 0; coefficient set 94 is programmed in the fifth set ($F_{out}$ Cycle No. 4, $F_t$ Cycle No. 16, etc.) of line 2; and coefficient set 3 is programmed in the $12^{th}$ set ($F_{out}$ Cycle No. 11, $F_t$ Cycle No. 23, etc.) of line 5.

FIG. 12 illustrates another example coefficient set table 1200 for an example case in which L=96 and M=121. As with the table 1100, each entry in the table 1200 indicates the coefficient set to be used for a given parallel line (indicated by the corresponding column index 1102) and given cycle number indicated by the corresponding row index 1103). In the example illustrated in FIG. 12, the requirement of 12 coefficient sets per line remains the same; hence, 12 banks are dedicated for each parallel line, but the coefficient sets required on the lines has changed per L/M. For example, using the specific cases discussed above with reference to table 1100, referring to the table 1200, in the case in which L/M=96/121, coefficient set 8 is programmed in the second set ($F_{out}$ Cycle No. 1, $F_t$ Cycle No. 13, $F_{out}$ Cycle No. 25, etc.) of line 0; coefficient set 82 is programmed in the fifth set ($F_{out}$ Cycle No. 4, $F_{out}$ Cycle No. 16, etc.) of line 2; and coefficient set 21 is programmed in the $12^{th}$ set ($F_{out}$ Cycle No. 11, $F_t$ Cycle No. 23, etc.) of line 5.

A select line of the coefficient MUX is a simple down counter running at $F_{out}$. The value of the counter depends on L. In particular, the counter value is the same as the number of coefficient sets spanned as explained above. The minimum counter is $L_{max}/P$, where the select line moves from $(L_{max}/P)-1$ to 0. The select line generation doesn't depend on both L and M, thereby eliminating the need for modulo generation as required in the direct implementation method. Additionally, using the present method, the proposed select line is common to all of the parallel lines, thus simplifying the select line generation hardware.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A sample rate converter ("SRC") for implementing a rate conversion L/M, wherein L is an upconversion factor of the SRC and M is a downconversion factor of the SRC, and wherein data is input to the SRC at an input rate ("$F_{in}$") and output from the SRC at an output rate ("$F_{out}$") equal to $F_{in}$*L/M, the SRC comprising:
a low pass filter ("LPF") including P filters, wherein P is a parallelization factor of the SRC;
an input formatter for arranging samples received at the SRC in accordance with the rate conversion L/M and providing a number of input samples to the filter at a given time; and
a coefficient bank for storing a plurality of coefficients and for providing a number of the coefficients to the LPF at a given time.

2. The SRC of claim 1, wherein the number of input samples comprises $P*T_{pp}$ input samples, wherein $T_{pp}$ is a number of taps per phase of the LPF, and wherein the input formatter receives the samples at $F_{in}$ and provides $P*T_{pp}$ input samples to the LPF at $F_{out}$.

3. The SRC of claim 1, wherein the number of the coefficients provided to the LPF at a given time comprises $P*T_{pp}$ of the coefficients, wherein $T_{pp}$ is a number of taps per phase of the LPF, and wherein the coefficient bank provides $P*T_{pp}$ of the coefficients to the filter at $F_{out}$.

4. The SRC of claim 1, wherein the input formatter comprises a first in first out ("FIFO") buffer for storing the received samples at $F_{in}$ and first circuitry for reading $N_{uniq}$ ones of the stored samples from the FIFO buffer at $F_{out}$.

5. The SRC of claim 4, wherein $N_{uniq}$=(P-1) * ceil(M/L) + $T_{pp}$, for ceil (M/L)<$T_{pp}$.

6. The SRC of claim 4, wherein the first circuitry comprises a first multiplexer (MUX) having inputs respectively connected to outputs of the FIFO buffer and a FIFO read pointer generator for generating a select signal to the MUX.

7. The SRC of claim 6, wherein the input formatter comprises second circuitry for selecting $P*T_{pp}$ of the $N_{uniq}$ ones of the stored samples read from the FIFO buffer in accordance with L/M to be provided to the filter as the $P*T_{pp}$ input samples.

8. The SRC of claim 7, wherein the second circuitry comprises at least one second MUX having inputs selectively connected to outputs of the first MUX and a MUX pointer for generating select signals to each at least one second MUX.

9. The SRC of claim 1, wherein each of the P filter instances implements a sum of products ("SOP") operation on coefficients and formatted samples received thereby to generate an output sample and outputs the output sample at $F_{out}$.

10. The apparatus of claim 1, wherein the coefficient bank rearranges coefficients stored therein in accordance with:

new$_{index}$(i,j)=mod[(iP+j)M,L]; and

Coeff$_{rearranged}$(i,j)=Coeff$_{original}$(new$_{index}$(i,j))

where i=0 to ((L/P)-1) and j=parallel line (0 to (P-1)).

11. The apparatus of claim 10, wherein the coefficient bank comprises P sets of L/P coefficient registers and P MUXes, wherein each one of the P sets of L/P coefficient registers is connected to input of one of the P MUXes, the coefficient bank further comprising a counter having an output connected to select inputs of each of the P MUXes, the counter having a maximum count value of (L/P)-1.

12. An apparatus comprising:
sample rate conversion circuitry ("SRC") for implementing a rate conversion L/M, wherein L is an upconversion factor of the SRC and M is a downconversion factor of the SRC, and wherein data is input to the SRC at an input rate ("$F_{in}$") and output from the SRC at an output rate ("$F_{out}$") equal to $F_{in}$*L/M, the SRC comprising:
a low pass filter ("LPF") including P filter instances, wherein P is a parallelization factor of the SRC;
an input formatter for arranging samples received at the SRC in accordance with the rate conversion L/M and providing a number of input samples to the filter at a given time, and
a coefficient bank for storing a plurality of coefficients and for providing a number of the coefficients to the LPF at a given time;
wherein the input formatter receives the samples at $F_{in}$ and provides the number of input samples to the LPF at $F_{out}$; and
wherein the coefficient bank provides the number of the coefficients to the filter at $F_{out}$.

13. The apparatus of claim 12, wherein the input formatter comprises:
a first in first out ("FIFO") buffer for storing the received samples at $F_{in}$; and
read circuitry for causing $N_{uniq}$ ones of the stored samples to be read from the FIFO buffer at $F_{out}$;
wherein the read circuitry comprises a first multiplexer (MUX) having inputs respectively connected to outputs of the FIFO buffer and a FIFO read pointer generator for generating a select signal to the MUX.

14. The apparatus of claim 13, wherein the input formatter comprises select circuitry for selecting $P*T_{pp}$ of the $N_{uniq}$ ones of the stored samples read from the FIFO buffer in accordance with L/M to be provided to the filter as the $P*T_{pp}$ input samples, wherein $T_{pp}$ is a number of taps per phase of the LPF, and wherein the select circuitry comprises at least one second MUX having inputs selectively connected to outputs of the first MUX and a MUX pointer generator for generating select signals to each at least one second MUX.

15. The apparatus of claim 12, wherein the coefficient bank rearranges coefficients stored therein in accordance with a function of P, M, and L.

16. The apparatus of claim 15, wherein the coefficient bank comprises P sets of L/P coefficient registers and P MUXes, wherein each one of the P sets of L/P coefficient registers is connected to input of one of the P MUXes, the coefficient bank further comprising a counter having an output connected to select inputs of each of the P MUXes, the counter having a maximum count value of (L/P)-1.

17. A method for performing a sample rate conversion L/M, wherein L is an upcoming factor of the SRC and M is a downconversion factor of the SRC, and wherein data wherein an input data rate is $F_{in}$ and an output data rate is $F_{out}$ and wherein $F_{out}$ is equal to $F_{in}$*L/M, the method comprising:
receiving data samples at $F_{in}$;
storing the received data samples in a first in first out ("FIFO") buffer;

reading $N_{uniq}$ ones of the stored received data samples from the FIFO buffer at $F_{out}$;

a number of the $N_{uniq}$ ones of the stored received data samples read from the FIFO buffer to be provided to the filter;

providing the selected number of ones of the $N_{uniq}$ ones of the stored received data samples read from the FIFO buffer to the filter at $F_{out}$; and outputting a number of ones of a plurality of stored coefficients to the filter at $F_{out}$.

18. The method of claim 17, wherein the reading is performed using read circuitry comprising a first multiplexer (MUX) having inputs respectively connected to outputs of the FIFO buffer and a FIFO read pointer generator for generating a select signal to the MUX.

19. The method of claim 18, wherein the selecting is performed by select circuitry comprising at least one second MUX having inputs selectively connected to outputs of the first MUX and a MUX pointer generator for generating select signals to each at least one second MUX.

20. The method of claim 17 further comprising rearranging the stored coefficients before the outputting in accordance with a function of P, M, and L.

* * * * *